(12) United States Patent
Hassan-Ali et al.

(10) Patent No.: US 9,312,400 B2
(45) Date of Patent: Apr. 12, 2016

(54) POWER HARVESTING DEVICE

(75) Inventors: Mudhafar Hassan-Ali, Petaluma, CA (US); Boris Golubovic, San Francisco, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 826 days.

(21) Appl. No.: 13/175,756

(22) Filed: Jul. 1, 2011

(65) Prior Publication Data

US 2013/0002045 A1 Jan. 3, 2013

(51) Int. Cl.
| | |
|---|---|
| H02J 1/00 | (2006.01) |
| H02J 3/00 | (2006.01) |
| H01L 31/02 | (2006.01) |
| H02M 3/07 | (2006.01) |
| H02M 3/156 | (2006.01) |
| G01S 13/75 | (2006.01) |
| H02M 1/00 | (2007.01) |

(52) U.S. Cl.
CPC ......... H01L 31/02021 (2013.01); G01S 13/758 (2013.01); H02M 3/07 (2013.01); H02M 3/156 (2013.01); H02M 2001/0006 (2013.01); Y02E 10/50 (2013.01); Y10T 307/858 (2015.04)

(58) Field of Classification Search
CPC H02M 3/07; H02M 3/156; H02M 2001/0006
USPC ......................................................... 307/130
See application file for complete search history.

(56) References Cited

U.S. PATENT DOCUMENTS 5,654,859 A   8/1997  Shi
6,259,235 B1  7/2001  Fraidlin et al.
6,412,072 B2  6/2002  Little et al.
6,710,582 B2  3/2004  Watanabe
7,126,314 B2 10/2006  McGinty et al.
7,190,207 B2  3/2007  Chen
7,453,308 B2 11/2008  Tihanyi (Continued)

FOREIGN PATENT DOCUMENTS

CN    101192756 A    6/2008
CN    101562442 A   10/2009

(Continued)

OTHER PUBLICATIONS

PCT/EP2012/062239 International Search Report dated Dec. 11, 2013.
Office Action issued Nov. 2, 2015 for Chinese Appln. No. 201280033037.3.

*Primary Examiner* — Hal Kaplan (57) ABSTRACT

Techniques are described to harvest power from a single current carrying conductor to furnish power to a powered device. The techniques employ a power harvesting device that is coupled to the conductor. In implementations, the conductor has a first path and a second path. The power harvesting device includes a first switch coupled to the second path. An energy storing element is coupled to the first path and configured to store energy based upon the direct current flowing through the first path. The power harvesting device also includes a power condition and management device coupled to the energy storing element configured to switch the first switch to a closed configuration when the energy storing element is measured to have a predefined high voltage threshold, and to switch the first switch to an open configuration when the energy storing element is measured to have a predefined low voltage threshold.

19 Claims, 7 Drawing Sheets

(56) References Cited

U.S. PATENT DOCUMENTS

| | | |
|---|---|---|
| 7,519,005 B2 | 4/2009 | Hejdeman et al. |
| 7,545,133 B2 | 6/2009 | Fujino et al. |
| 7,782,240 B2 | 8/2010 | Ng et al. |
| 2006/0062026 A1 | 3/2006 | Wittenbreder, Jr. |
| 2008/0239772 A1* | 10/2008 | Oraw et al. ............ 363/60 |
| 2008/0266917 A1* | 10/2008 | Lin et al. .............. 363/80 |
| 2009/0051333 A1 | 2/2009 | Jo et al. |

FOREIGN PATENT DOCUMENTS

| | | |
|---|---|---|
| CN | 201616775 | 10/2010 |
| DE | 4440529 | 5/1996 |
| DE | 102007060329 | 7/2009 |
| DE | 102008040310 | 1/2010 |
| WO | 2009077040 A2 | 6/2009 |

\* cited by examiner

POWER HARVESTING DEVICE

BACKGROUND

It is often necessary to provide electrical power to electrical or electronic devices that are located remotely or accessed infrequently. However, in many cases, the infrastructure required to transmit electrical power to these devices is unavailable or is prohibitively expensive to install. For example, systems that monitor photovoltaic (PV) solar installations employ sensors that monitor the PV modules of the installation and transmit information describing the operation of the modules to a central gateway where the information is collected to be processed. Increasingly, these monitoring systems employ a wireless sensor network (WSN) configuration wherein the sensors are provided with a transmitter to transmit the information via a wireless signal sent to the gateway (e.g., to a receiver coupled to the gateway). Because the transmitters have limited range compared to the size of some PV solar installations, the monitoring systems may further employ transceivers to regenerate and retransmit the wireless signal. However, providing electrical power to power the transceivers adds infrastructure to the PV solar installation, which may be located in a remote area so that it is accessed infrequently, making the addition of such infrastructure costly.

SUMMARY

Techniques are described to harvest power from a single conductor (e.g., a wire carrying DC current or AC current) to furnish power to a powered device such as a sensor, transmitter, transceiver, motor, switch, combinations thereof, and so forth. The techniques employ a power harvesting device that is coupled to the conductor. In one or more implementations, the conductor has a first path and a second path. The power harvesting device includes a first switch coupled to the second path, and having an open configuration and a closed configuration. An energy storing element is coupled to the first path and configured to store energy based upon the direct current flowing through the first path. The power harvesting device also includes a power condition and management device coupled to the energy storing element. The power condition and management device is configured to switch the first switch to the closed configuration when the energy storing element is measured to have a predefined high voltage threshold, and to switch the first switch to the open configuration when the energy storing element is measured to have a predefined low voltage threshold.

BRIEF DESCRIPTION OF DRAWINGS

The detailed description is described with reference to the accompanying figures. The use of the same reference numbers in different instances in the description and the figures may indicate similar or identical items.

DETAILED DESCRIPTION OF SPECIFIC EMBODIMENTS

Overview

In many cases, it is desirable to harvest Direct Current (DC) power or Alternating Current (AC) power from a host system to power supplemental electrical or electronic devices in proximity to the host system. For example, electronic components, such as sensors, transmitters, transceivers, and so forth, of monitoring systems used to monitor operation of PV solar installations may harvest power from the PV modules within the installations. However, providing a connection across positive and negative conductors (wires) supplied with DC current by the PV modules can be difficult. Because the DC current supplied by the PV modules is typically high voltage, a high voltage to low voltage conversion may be required. Moreover, the positive and negative conductors (wires) often do not run as a pair making the connection impractical or impossible.

Accordingly, a power harvesting device is described. The power harvesting device is configured to harvest power from a single conductor (e.g., a wire carrying DC current or AC current) to furnish power to an electrical or electronic device such as a sensor, transmitter, transceiver, motor, switch, and so forth (hereinafter a "powered device"). In one or more implementations, the conductor has a first path and a second path. The power harvesting device includes a first switch coupled to the second path, and having an open configuration and a closed configuration. For example, the first switch may be an enhancement-mode transistor device, or the like. An energy storing element, such as a capacitor, is coupled to the first path and configured to store energy based upon the direct current flowing through the first path. The power harvesting device also includes a power condition and management device coupled to the energy storing element. The power condition and management device is configured to switch the first switch to the closed configuration when the energy storing element is measured to have a predefined high voltage threshold, and to switch the first switch to the open configuration when the energy storing element is measured to have a predefined low voltage threshold. In one or more implementations, the power condition and management device includes a switched mode power supply (e.g., a boost converter) configured to generate an output DC voltage that is greater than the supplied DC input voltage. The output DC voltage is utilized to power the powered device. In one or more implementations, a diode, such as a Schottky diode, may be positioned before the energy storing element to rectify an AC current to a DC current so that a voltage is generated at the energy storing element based upon the rectified DC current.

The powered device may comprise a transceiver that is configured to transmit wireless signals and/or to receive wireless signals. In one or more implementations, the transceiver may be a low-power transceiver complying with the IEEE 802.15.4-2006 standard. A sensor may be in communication with the transceiver. The sensor may be configured to measure one or more characteristics of a system and provide electrical signals representing the characteristics to the transceiver for transmission of the signals. For example, the sensor may measure photovoltaic (PV) module efficiency, data center temperatures, and so forth.

Thus, the power harvesting device does not require connection across positive and negative conductors, which may be impractical or impossible due to separation of the conductors. Moreover, because the device is not connected across positive and negative conductors, the device does not require a high voltage to a low voltage conversion. Thus, the power harvesting device facilitates selective placement of a powered device along a DC conductor.

Example Power Harvesting Devices

Figure 1:
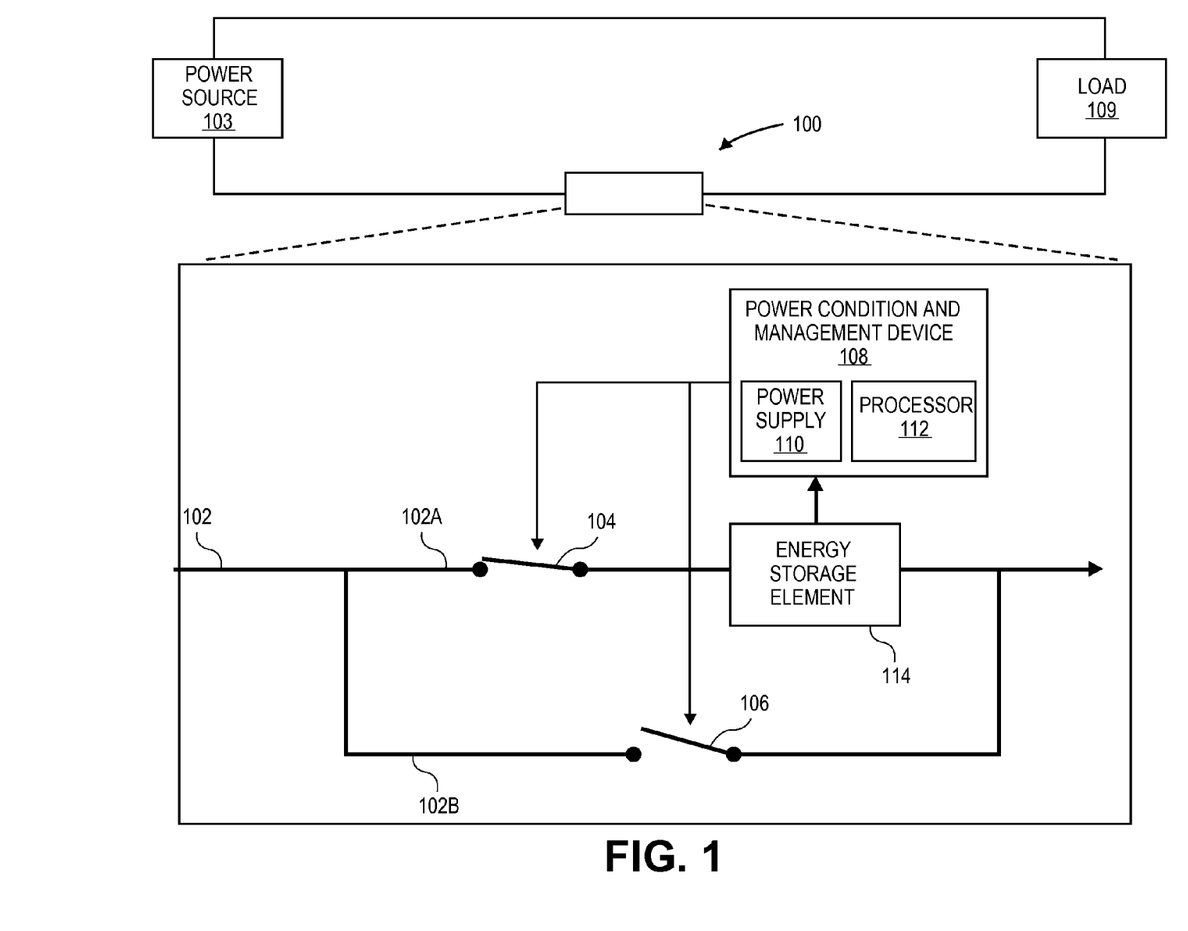
FIG. 1 is a schematic diagram illustrating a power harvesting device in accordance with an example implementation of the present disclosure.

FIG. 1 illustrates a power harvesting device 100 in accordance with an example implementation of the present disclosure. As shown, the power harvesting device 100 is operable to harvest power from a current-carrying conductor 102 in a unidirectional configuration. The current-carrying conductor 102 carries DC current or AC current furnished by a power source 103 (e.g., a DC power source or an AC power source). The conductor 102 may be configured in a variety of ways. For example, the conductor 102 may be a single wire or cable, which may be insulated. However, it is contemplated that the conductor may be any medium capable of carrying a DC current.

As illustrated in FIG. 1, the harvesting device 100 includes a first switch 104 and a second switch 106. In one or more implementations, the first and second switches 104, 106 may be transistors, such as metal-oxide-semiconductor field-effect transistors (MOSFETs), insulated-gate bipolar transistors, electromechanical relay, and the like. The switches 104, 106 have an open configuration (e.g., open circuit to prevent current flow) and a closed configuration (e.g., closed circuit to allow current flow). The first switch 104 is configured to be in a closed configuration when the second switch 106 is in an open configuration, and vice versa. As shown in FIG. 1, the first switch 104 is connected to a first path 102A of the conductor 102, and the second switch 106 is connected to a second path 102B of the conductor 102. The configuration of the switches 104, 106 is controlled by a power condition and management device 108 that is described herein. For example, the power condition and management device 108 furnishes a suitable voltage level to the switches 104, 106 so that the switches 104, 106 are in the desired configuration (e.g., open configuration, closed configuration).

As illustrated in FIG. 1, the power condition and management device 108 includes a switched-mode power supply 110. The switched mode power supply 110 may be configured in a variety of ways. For example, the power supply 110 may be a boost converter, or the like. The power supply 110 is configured to furnish an output DC voltage that is greater than the DC input voltage supplied to the power supply 110. The input voltage and the output voltages may vary depending on specific design requirements of power harvesting device 100.

The power condition and management device 108 may further include a processing device, such as a microprocessor 112, to provide voltage detection functionality and to control switch functionally. The microprocessor 112 is configured to (e.g., includes electronic circuitry configured to) detect a DC input voltage at the device 108. The microprocessor 112 is also configured to control the configuration of the switches 104, 106 as a function of the detected (e.g., measured) DC input voltage. For example, the microprocessor 112 may furnish an open configuration signal (e.g., voltage signal, etc.) to the first switch 104 and a closed configuration signal (e.g., voltage signal, etc.) to the second switch 106 when a predefined high voltage threshold is detected. In one or more implementations, the predefined high voltage threshold may be approximately ninety percent (90%) of the voltage required to allow for sufficient operation of the power condition and management device 108. Conversely, the microprocessor 112 may furnish the closed configuration signal to the first switch 104 and the open configuration signal to the second switch 106 when a predefined low voltage threshold is detected. In one or more implementations, the predefined low voltage threshold may be approximately fifty percent (50%) of the voltage required to allow for sufficient operation of the power condition and management device 108. However, other predefined high and low threshold values may be utilized depending upon specific application design requirements. Moreover, the predefined high and low threshold values may be chosen based upon hardware requirements associated with the power condition and management device 108, and so forth.

As illustrated in FIG. 1, an energy storage element 114 is in electrical communication with the power condition and management device 108. The energy storage element 114 may be configured in a variety of ways. For example, the energy storage element 114 may be a capacitor, an inductor, or any other element capable of storing energy. In an implementation, the storage element 114 stores energy when the first switch 104 is in a closed configuration due to the flow of current through the first switch 104. When the first switch 104 is in an open configuration, the current flows through the second switch 106 and allows the storage element 114 to dissipate energy. In one or more implementations, a voltage at the storage element 114 is provided to the power condition and management device 108 as a DC input voltage to the switched-mode power supply 110. As described above, the power supply 110 is configured to generate a DC output voltage that is greater than the DC input voltage. The output voltage is then utilized to at least partially power the microprocessor 112 and other powered devices associated with the harvesting device 100.

As described above, the power harvesting device 100 is configured to harvest energy from a current carrying conductor (e.g., conductor 102). The first switch 104 is initially in a closed configuration to allow the energy storage element 114 to store energy (e.g., electric charge in the case of a capacitor, etc.) due to allowing current to at least substantially flow through the first switch 104 and the first path 102A. Moreover, the second switch 106 is initially in an open configuration to at least substantially prevent current flow through the switch 106, and therefore, to at least substantially prevent current flow through the second path 102B. Once a predefined high input voltage threshold is detected (e.g., by power condition and management device 108) across the storage element 114, the device 108 provides an open signal to the first switch 104 to switch to an open configuration and a close signal to the second switch 106 to switch to a closed configuration. The switch configuration allows current to flow through the second switch 106 and prevents current from flowing through the first switch 104. Once a predefined low input voltage threshold is detected across the storage element 114, the device 108 provides the close signal to the first switch 104 to switch to the closed configuration and the open signal to the second switch 106 to switch to the open configuration. The current then flows through the first switch 104 to replenish the energy storage element 114 to the predefined high voltage threshold.

As shown in FIG. 1, the power harvesting device 100 may also be connected to a load 109. It is contemplated that the load 109 may comprise any conventional load element. For example, the load 109 may comprise a capacitive load, a reactive load, a resistive load, an inductive load, a combination thereof, or the like.

Figure 2:
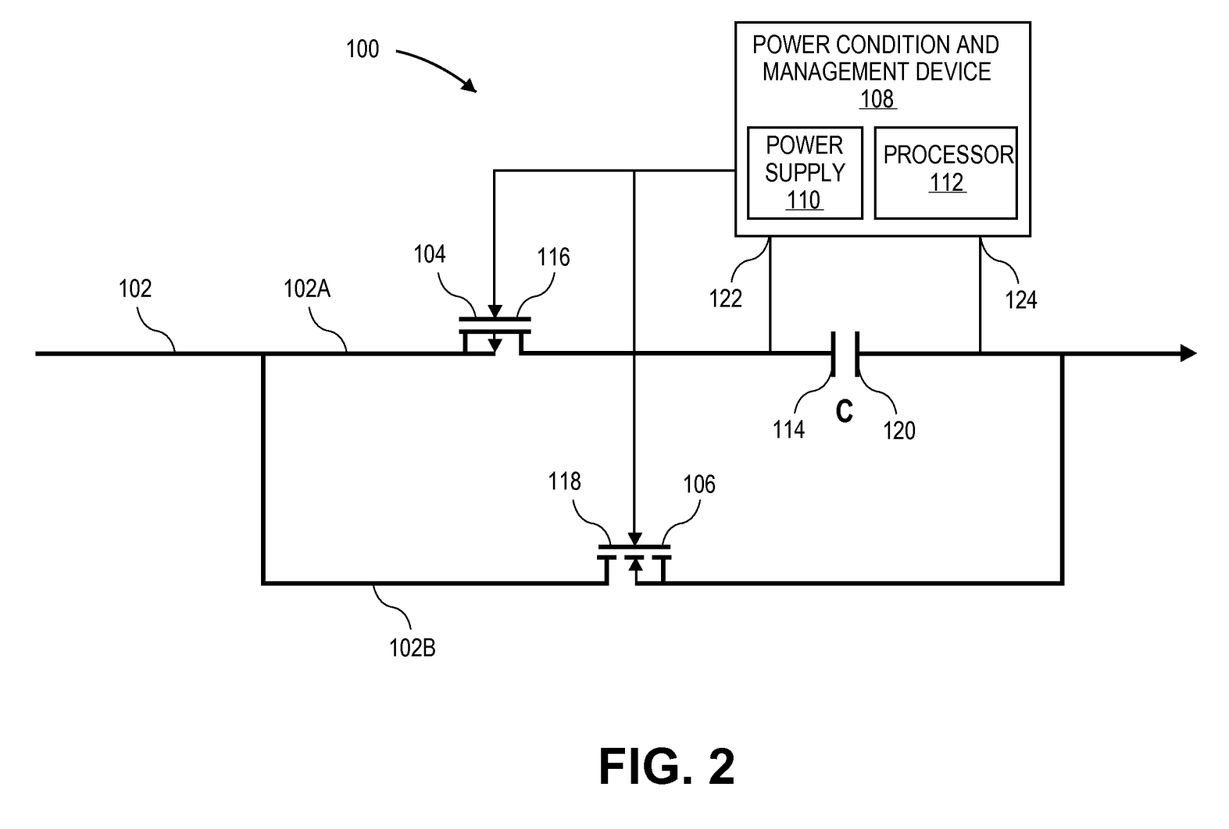
FIG. 2 is a schematic diagram illustrating an example implementation of the power harvesting device shown in FIG. 1, where the power harvesting device includes a depletion-mode device and an enhancement-mode device.

FIG. 2 illustrates a possible implementation of the power harvesting device 100. As shown, the first switch 104 comprises a depletion-mode MOSFET device 116, and the second switch 106 comprises an enhancement-mode MOSFET device 118. The depletion-mode MOSFET device 116 is configured so that a conductive channel exists (e.g., closed configuration) even with zero voltage applied from gate to source of the device 116. Therefore, the depletion-mode device 116 is typically operational until a sufficient voltage is applied to deplete the channel that prevents current flow (e.g., open configuration). The enhancement-mode device 118 initially has no conductive channel (e.g., open configuration). A conductive channel is generated (e.g., closed configuration) in the enhancement-mode MOSFET device 118 when a sufficient voltage (e.g., higher than the threshold voltage ("$V_t$")) is applied between the gate and source of the device 118. It is contemplated that the MOSFET device 118 may be an n-type MOSFET device or a p-type MOSFET device.

As shown, the energy storage element 114 comprises a capacitor 120 disposed between a first terminal 122 and a second terminal 124 of the power condition and management device 108. The capacitor 120 may be configured in a variety of ways. For example, the capacitor 120 may be configured to store electric charge so that the voltage of the capacitor 120 may be at least approximately 3.3V. In another example, the capacitor 120 may be configured to store electric charge so that voltage of the capacitor 120 is approximately 5V. The capacitor 120 values is determined by the amount of energy stored and the operating voltage as modeled by the equation:

$$C = \sqrt{\frac{P \cdot T_C}{V_H^2 - V_L^2}} \quad \text{(Equation 1)}$$

In Equation 1, P is the power consumption, $T_C$ is the capacitor replenishment cycle time, $V_H$ is highest voltage across the capacitor, and $V_L$ is the lowest voltage across the capacitor. Therefore, for P=100 mW, $T_C$=10 msec, $V_H$=10V, $V_L$=5V, and C=5 mF. It is contemplated that other capacitor 120 values may be chosen based upon characteristics of the power harvesting device 100, such as the discharge time of the capacitor 120, the power requirements of the components of the power condition and management device 108, and so forth.

In one or more implementations, a microprocessor 112 is configured to detect the voltage level across the capacitor 120. For example, the conductor 102 carries current initially through the depletion-mode device 116 so that the capacitor 120 can store electric charge. When a sufficient amount of electric charge is stored (e.g., predefined voltage threshold is reached on the capacitor 120, etc.), the microprocessor 112 provides an open signal to the depletion-mode device 116 and provides a close signal to the enhancement-mode device 118 so that current may flow through the enhancement-mode device 118 instead of the depletion-mode device 116. The voltage across the capacitor 120 is utilized as the input voltage to the power supply 110 (e.g., the power condition and management device 108) so that the power supply 110 may generate an output voltage greater than the input voltage. When the capacitor 120 dissipates enough electric charge that the microprocessor 112 detects the predefined low voltage threshold across the capacitor 120, the microprocessor 112 provides the close signal to the depletion-mode device 116 and the open signal to the enhancement-mode device 118.

Figure 3:
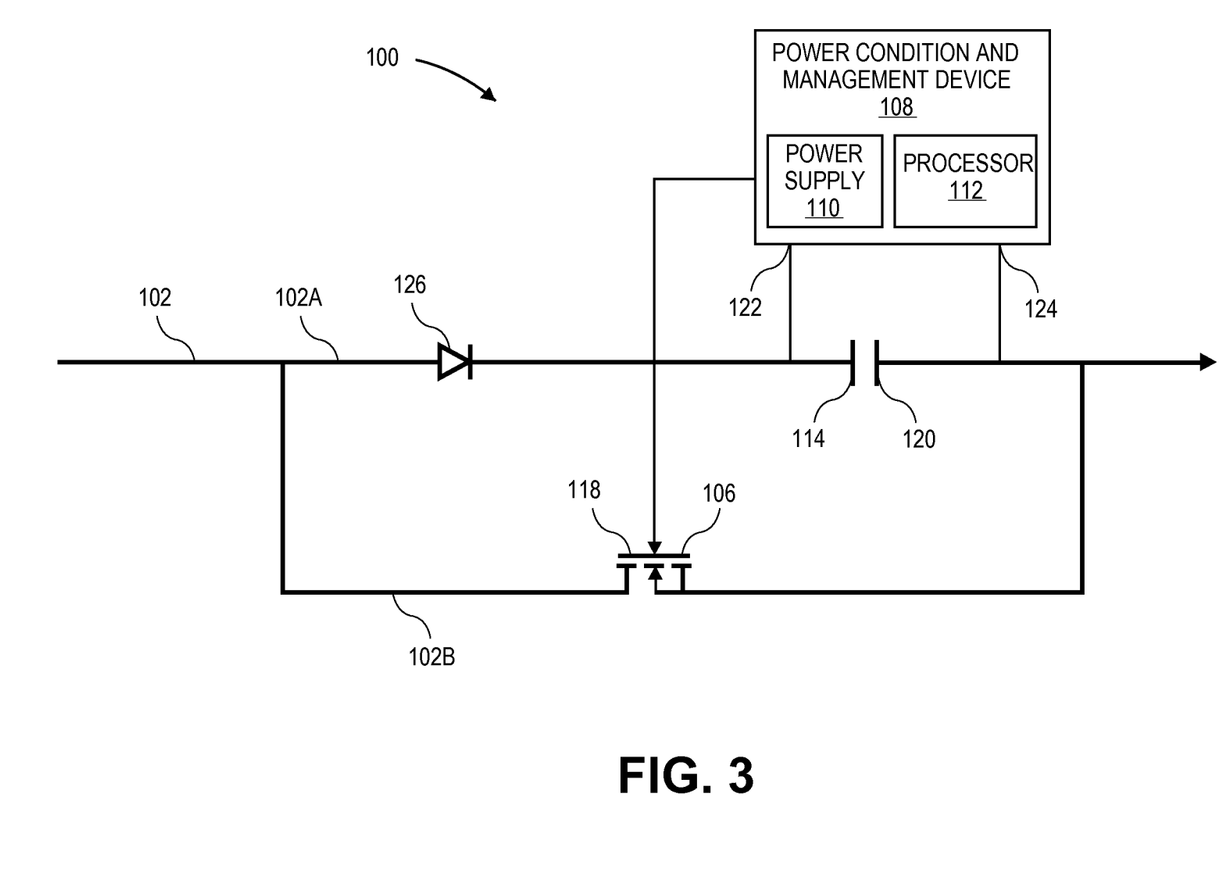
FIG. 3 is a schematic diagram illustrating an example implementation of the power harvesting device shown in FIG. 1, where the power harvesting device includes a diode and an enhancement-mode device.

FIG. 3 illustrates another possible implementation of the power harvesting device 100. As shown, a diode 126 replaces the first switch 104 in the first path 102A shown in FIGS. 1 and 2. In one or more implementations, the diode 126 may comprise, but is not limited to a Schottky diode, and so forth. The switch 106 may comprise an enhancement-mode device 118. The enhancement-mode device 118 is initially in a closed configuration to allow current to flow through the diode 126 and allow charging of the capacitor 120. Once the microprocessor 112 detects the predefined high voltage threshold across the capacitor 120, the microprocessor 112 provides a close signal to switch the enhancement-mode device 118 to the closed configuration that allows the current to then flow through the enhancement-mode device 118. Moreover, the orientation of the diode 126 prevents the reverse flow of current from the capacitor 120 to the diode 126 when the enhancement-mode device 120 is in the closed configuration. The voltage of the capacitor 120 is utilized by the power supply 110 to generate an output voltage that is configured to at least partially power the microprocessor 112, as well as other powered devices (e.g., transmitters, sensors, etc.) associated with the harvesting device 100.

In an implementation, the device 100 shown in FIG. 3 may be configured to harvest energy from an AC current carrying conductor 102. The diode 126 is a Schottky diode configured to rectify the AC current to a DC current. A voltage is then generated across the capacitor 120 based upon the rectified DC current. As described above, the microprocessor 112 detects the voltage across the capacitor 120 and provides a signal to the enhancement-mode device 118 based upon the detected the voltage.

Figure 4A:
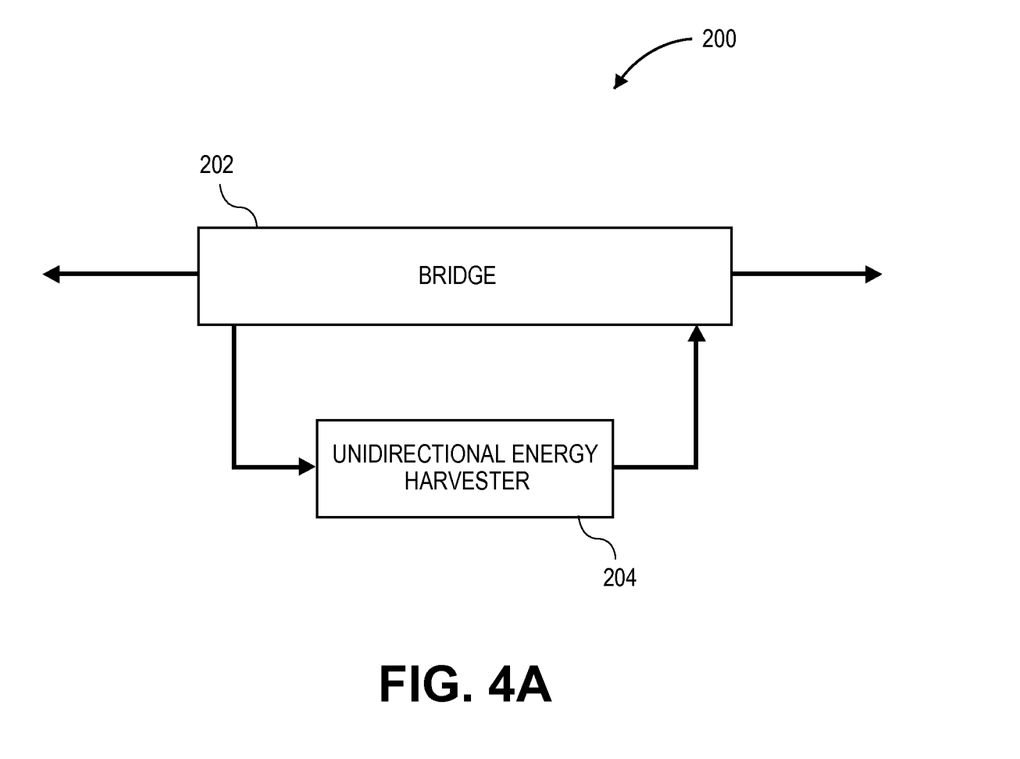
FIG. 4A is a schematic diagram illustrating another power harvesting device in accordance with another example implementation of the present disclosure.
Figure 4B:
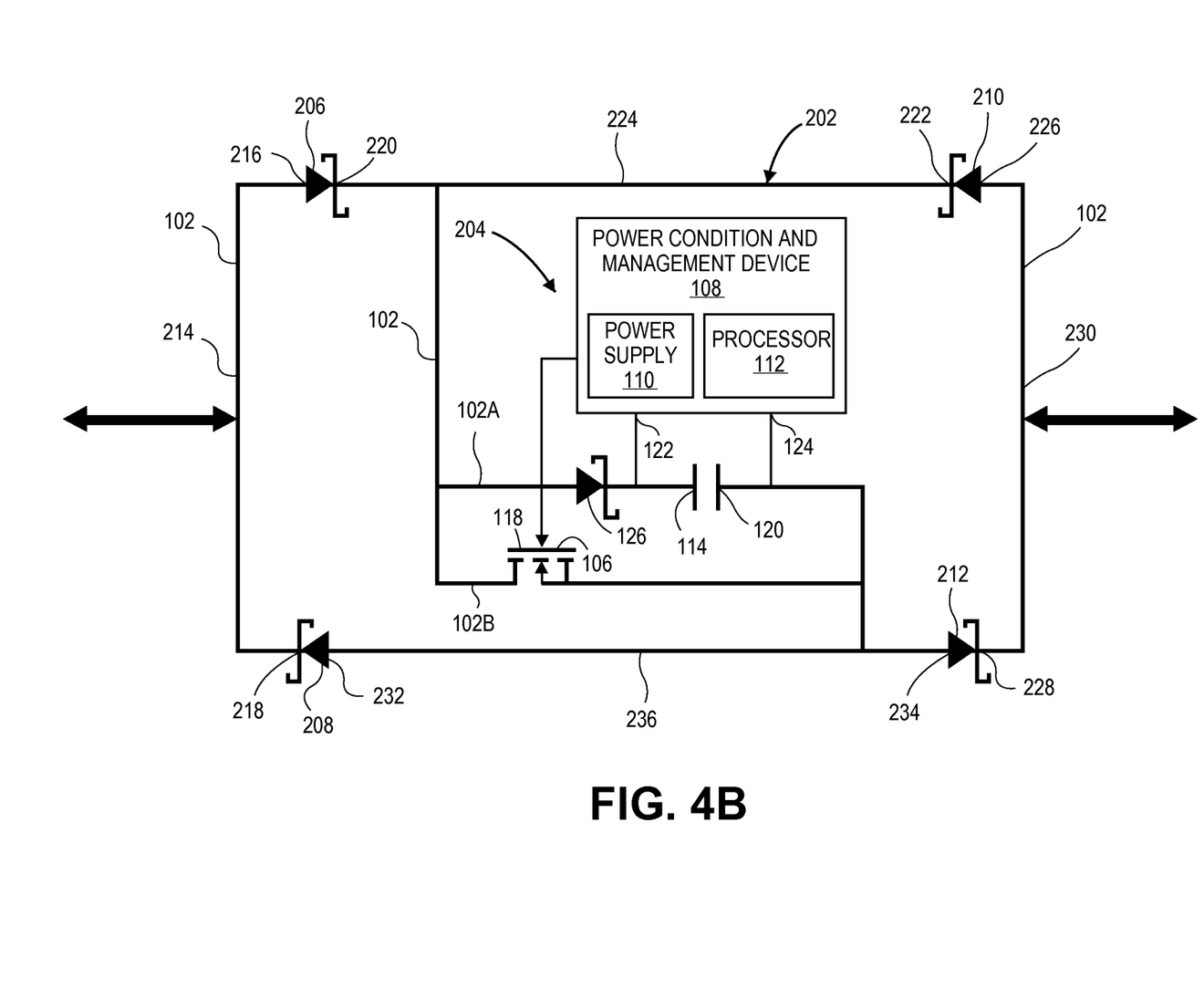
FIG. 4B is a circuit diagram illustrating an example implementation of the power harvesting device shown in FIG. 4A.

FIGS. 4A and 4B illustrate a bidirectional energy harvester 200. As illustrated in FIG. 4A, the harvester 200 incorporates a bridge architecture 202 to convert bidirectional current flow to unidirectional current flow to allow for utilization of a unidirectional energy harvester 204, such as the unidirectional energy harvester 100 described above. FIG. 4B illustrates a possible implementation of bidirectional energy harvester 200 that incorporates the bridge architecture 202 and the unidirectional energy harvester 204 shown in FIG. 4A. As shown, the unidirectional energy harvester 204 shown in FIG. 4B is of the same configuration (e.g., energy harvester 100) shown in FIG. 3. However, it is contemplated that other energy harvester configurations may be utilized, such as the energy harvesters described above and illustrated in FIGS. 1 and 2.

The energy harvester 200 includes four diodes 206, 208, 210, 212 arranged in a bridge architecture 202. As described above, the diodes 206, 208, 210, 212 may comprise a Schottky diode, or the like. The first diode 206 and the second diode 208 are connected together at a first node 214 of the current-carrying conductor 102. As shown, the anode end 216 of the first diode 206 and the cathode end 218 of the second diode 208 are connected to the first node 214. The cathode end 220 of the first diode 206 and the cathode end 222 of the third diode 210 are connected at a second node 224 of the conductor 102. The anode end 226 of the third diode 210 and the cathode end 228 of the fourth diode 212 are connected to a third node 230 of the conductor 102. Finally, the anode end 232 of the second diode 208 and the anode end 234 of the fourth diode 212 are connected to a fourth node 236 of the conductor 102.

The bridge 202 diode configuration illustrated allows for current traveling from the first node 214 portion of the conductor 102 to at least substantially flow through the first diode 206 and to at least substantially prevent current from flowing through the second diode 208 into the fourth node 236. Moreover, the configuration allows for current traveling from the second node 224 portion of the conductor 102 to at least substantially flow through the third diode 210 into the second node 224 and to at least substantially prevent current from flowing through the fourth diode 212 to the fourth node 236. Thus, first diode 206 and the fourth diode 212 conduct (e.g., allow current flow) when the direction of the current is from left to right when viewing FIG. 4B. Conversely, the second diode 208 and the third diode 210 conduct when the current is flowing from right to left when viewing FIG. 4B.

In an example implementation, current flows through the first node 214 through the first diode 206 into the second node 224. The current initially flows through the diode 126 to charge the capacitor 120. The power supply 110 of the power condition and management device 108 generates an output voltage as a result of the voltage between the terminals 122, 124 of the device 108. The output voltage is utilized to at least partially power the microprocessor 112 and the powered devices described above. In another implementation, current may also flow through the fourth node 236 through the third diode 210 into the second node 224. This current may also initially flow through the diode 126 to charge the capacitor 120. The power supply 110 of the power condition and management device 108 generates an output voltage as a result of the voltage between the terminals 122, 124 of the device 108.

Figure 5A:
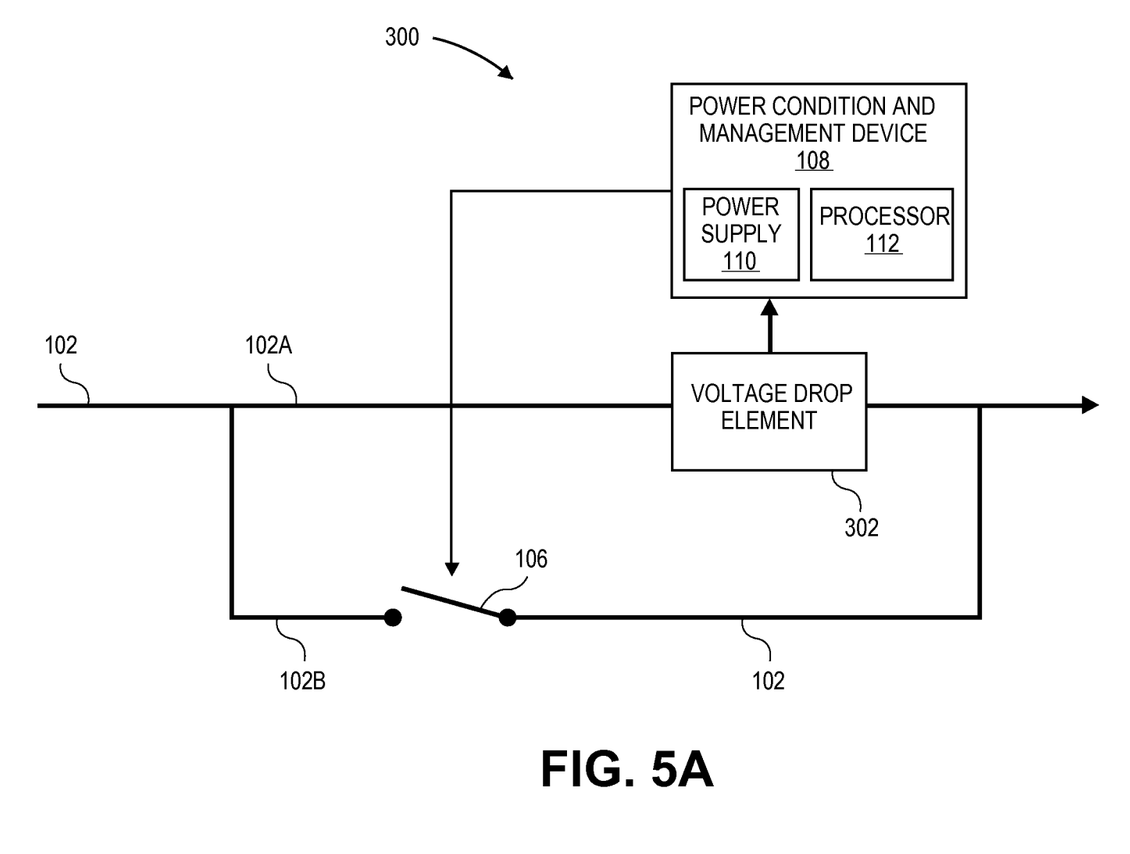
FIG. 5A is a schematic diagram illustrating another power harvesting device in accordance with another example implementation of the present disclosure.
Figure 5B:
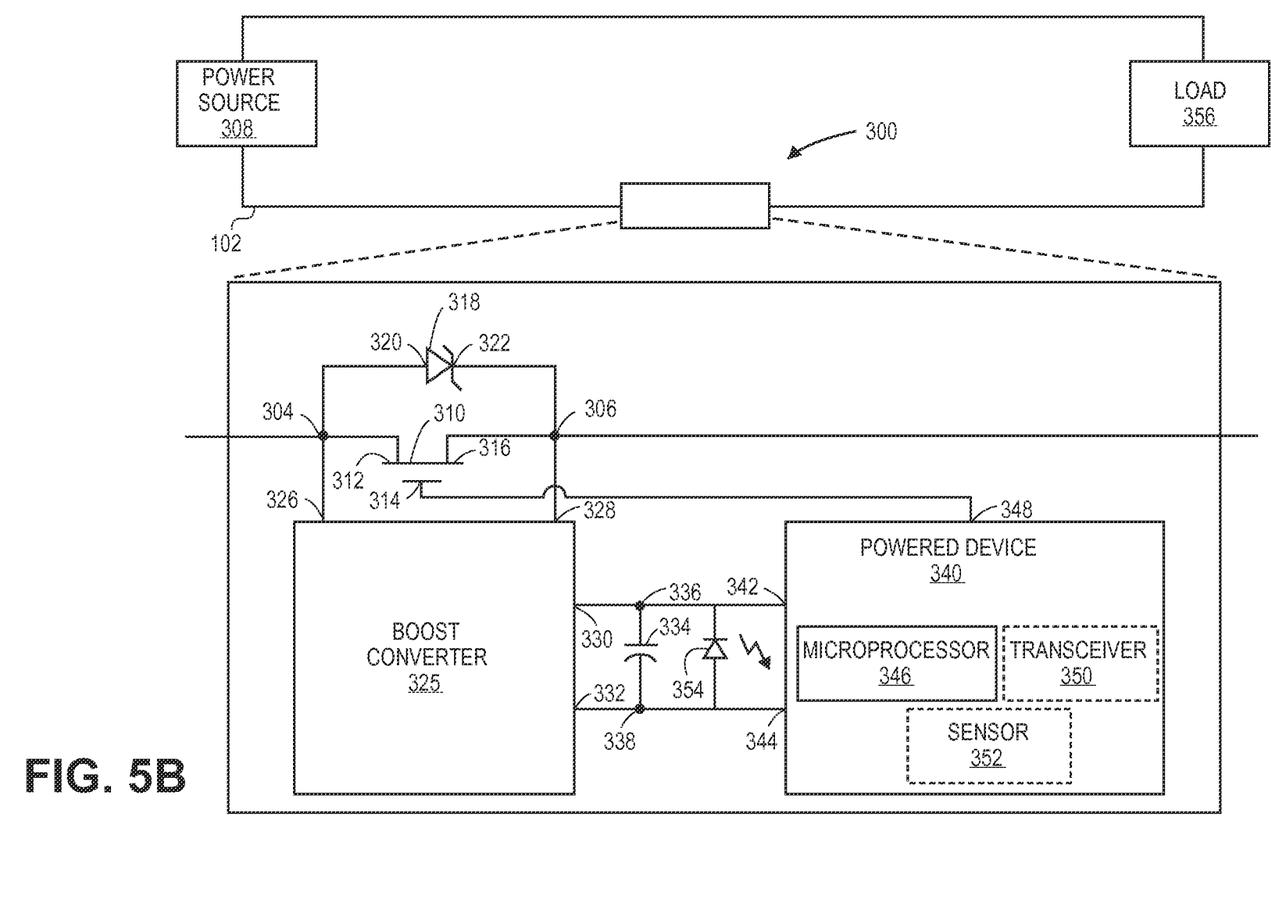
FIG. 5B is a circuit diagram illustrating an example implementation of the power harvesting device shown in FIG. 5A.

FIGS. 5A and 5B illustrate a voltage drop based energy harvesting device 300. As shown in FIG. 5A, the energy harvesting device 300 includes the conductor 102, the switch 106, the power condition and management device 108, and a voltage drop element 302. FIG. 5B illustrates an example implementation of the energy harvesting device 300 that includes an energy storing element configured to store energy that at least partially powers a powered device. As shown, the power harvesting device 300 is configured to harvest power from a current-carrying conductor 102 that includes a first node 304 and a second node 306.

The power harvesting device 300 is also connected to a power source 308 (e.g., a DC power source, an AC power source) through the conductor 102. A variety of power sources 308 are possible. For example, the power source 308 can comprise one or more PV modules of a PV solar installation. The PV modules convert solar radiation into direct current (DC). Similarly, the power source 308 can be a component (e.g., a power supply) within a data center. In such implementations, the data center may include one or more computing devices (e.g., servers, data storage devices, etc.) housed together in close proximity to each other. The data center is configured to run one or more services per request of other computing devices (e.g., clients), store data, and so forth. The power source 308 may be configured to supply DC electrical power to at least some of the computing devices within the data center as well as the conductor 102.

A transistor 310, which includes a source 312, a gate 314, and a drain 316, is connected to the conductor 102. As shown, the source 312 is connected to the first node 104, and the drain 316 is connected to the second node 306. The transistor 310 allows current to pass (e.g., current flows through the source 312 to the drain 316) when a sufficient voltage (e.g., a voltage of the correct polarity that is over the threshold voltage ("$V_t$") of the transistor 310) is applied to the gate 314. Conversely, the transistor 310 at least substantially blocks the flow of current (e.g., does not allow current to flow from the source 312 to the drain 316) when no or insufficient voltage (less than "$V_t$") is applied to the gate 314. The transistor 310 may be configured in a variety of ways. For example, the transistor 310 may be configured as an enhanced-mode device as described above, which may be comprised of an enhanced-mode NMOS transistor or an enhanced-mode PMOS transistor. The NMOS transistor configuration comprises a transistor 310 that has electrons as the majority carrier, and the PMOS configuration comprises a transistor 310 that has holes (e.g., absence of electrons) as the majority carrier. In another example, the transistor 310 may comprise a power MOSFET transistor that is configured to handle significant power levels. The power MOSFET transistor 310 may have a Vertical Diffused MOS structure (VDMOS), or the like. However, it is contemplated that power MOSFET transistors 310 of varying structures may be utilized, depending on the desired characteristics of the power harvesting devices 300.

The power harvesting device 300 also includes a diode 318 having an anode terminal 320 and a cathode terminal 322. The diode 318 is configured to allow current to flow in only one direction (e.g., from the anode to the cathode). The anode terminal 320 is connected to the conductor 102 via node 304, and the cathode terminal 322 is connected to the conductor 102 via node 306. Thus, the diode 318 is connected in parallel with the transistor 310. The diode 318 may be configured in a variety of ways. For example, the diode 318 may be a Schottky diode, which has a low forward-voltage drop (e.g., a forward-voltage drop of at least approximately 0.15V to at least approximately 0.45V) when in operation, a TVS diode, a low voltage TVS diode, and the like. However, it is contemplated that the voltage across the diode 318 may vary due to the current and the type of transistor 310. For example, the voltage may vary from at least approximately 0.3V to at least approximately 1.3V. The voltage may also be below 0.3V in some implementations and above 1.3V in other implementations.

In FIG. 5B, the power supply of the power condition and management device 108 is illustrated as comprising a boost converter 325, connected in parallel to the transistor 310 and the diode 318. As illustrated, a first terminal 326 of the boost converter 325 is connected to the first node 304, and a second terminal 328 of the boost converter 325 is connected to the second node 306. The boost converter 325 is configured to furnish an output DC voltage to the output terminals (e.g., third terminal 330 and fourth terminal 332) that is greater than the DC input voltage. In an implementation, the boost converter 325 receives an input voltage via the input terminals 326, 328 (e.g., the voltage across the diode 318) and generates an output voltage at the output terminals 330, 332 that is greater than the input voltage. For example, the input voltage may be approximately 0.3V and the output voltage may be approximately 3.3V. In another example, the input voltage may be approximately 1.3V and the output voltage may be approximately 5V. However, as described above, the input voltage and the output voltages may vary depending on specific application design requirements of power harvesting device 100.

As illustrated in FIG. 5B, a capacitor 334 is disposed between the boost converter terminals 326, 328 via a third node 336 and a fourth node 338. The capacitor 334 is configured to store electric charge from the output voltage furnished by the boost converter 325. The capacitor 334 may be configured in a variety of ways. For example, the capacitor 334 may be configured similar to the capacitors described above. However, it is contemplated that various capacitor 334 values may be chosen based upon characteristics of the power harvesting device 300, such as the discharge time of the capacitor 334, the power requirements of a powered device 340, and so forth.

The stored electric charge is used to power a powered device 340. The powered device 340 includes a first powered device terminal 342 connected to the third node 336 and a second powered device terminal 344 connected to the fourth node 338. As shown in FIG. 5B, the terminals 342, 344 are configured in such a way that the powered device 340 is at least partially powered by the stored electric charge on the capacitor 334. In one or more other implementations, the stored electric charge may provide sufficient power to fully power the powered device 340 (and electronic components included in powered device 340).

As illustrated in FIG. 5B, the powered device 340 includes a processing device such as a microprocessor 346, which provides functionality to (e.g., includes electronic circuitry configured to) detect the voltage stored in the capacitor 334 and control the gate 314 of the transistor 310 via a third powered device terminal 348. In an implementation, the microprocessor 346 may be a low-power microprocessor that comprises electronic circuitry configured to the control the gate 314 of the transistor 310 based on the electric charge stored in the capacitor 334.

The microprocessor 346 is configured to furnish a signal (e.g., a voltage signal, etc.) so that the transistor 310 switches to a closed configuration (e.g., turn the transistor 118 on) when the capacitor 334 reaches a high threshold of stored electric charge. For example, the high threshold may be an amount of stored electric charge that produces a voltage across the capacitor 334 that at least substantially equals (e.g., 90% or greater) the output voltage furnished by the boost converter 325. However, the high threshold may vary depending on the specific requirements of the powered device 340 (e.g., depending on the power requirements of the microprocessor 346 and other components of the powered device 340). The microprocessor 346 is also configured to furnish a signal so that the transistor 310 switches to an open configuration (e.g., at least substantially no current passes through the transistor 310) when the capacitor 334 reaches a low threshold of stored electric charge. For example, the low threshold may be an amount of stored electric charge so that capacitor 334 voltage at least substantially equals half of the output voltage (e.g., 50% of the output voltage) furnished by the boost converter 325. However, the low threshold may vary depending on the specific requirements of the powered device 340 (e.g., depending on the power requirements of the microprocessor 346 and other components of the powered device 340).

As shown in FIG. 5B, the powered device 340 may also include a transceiver 350. The transceiver 350 may be configured in a variety of ways. For example, the transceiver 350 may be configured as a transmitter to transmit wireless signals. The transceiver 350 may also be configured as a receiver to receive wireless signals. In yet another example, the transceiver 350 may be configured as a re-transmitter to re-transmit received wireless signals. In one or more implementations, the transceiver 350 may comprise a low-power transceiver, such as ZIGBEE brand transceiver that is based on the IEEE 802.15.4-2006 standard. However, it is contemplated that other types of transceivers may be provided depending on requirements of the device 300. Such requirements may include considerations such as the distance the wireless signals must travel, the encryption of the wireless signals, the power constraints of the powered device 340, combinations thereof, and so forth.

In some implementations, the transceiver 350 may be in communication with a sensor 352. The sensor 352 may comprise electronic circuitry configured to measure one or more characteristics of a system (e.g., PV module efficiency, data center temperatures, etc.) and to convert the measured characteristics into electrical signals. These electrical signals may in turn be converted to wireless signals transmitted by the transceiver 350. As illustrated in FIGS. 2 and 3, the sensor 352 may be integral with the powered device 340, and thus in direct communication with transceiver 350. However, it is contemplated that the sensor 352 may also be integral with the system (e.g., integral with a PV module, integral with computer equipment within the data center, etc.). In this implementation, the sensor 352 may be in electrical contact with a transmitter (not shown) that is configured to transmit information describing the measured characteristics of the system to the transceiver 350 for re-transmission (e.g., regeneration).

In implementations, the transceiver 350 is configured to transmit and/or retransmit information describing the operation (performance) of a system to which the powered device 340 is connected. For example, in a PV solar installation environment, the transceiver 350 may be configured to transmit wireless signals encoded with information describing operation of a PV module within the installation. Similarly in the data center environment, the transceiver 350 may be configured to transmit wireless signals encoded with information describing the operation of computer equipment within a data center. The encoded information may be collected by the sensor 352. In an implementation, the encoded information may be provided by the sensor 352 to a transmitter, which transmits the information to the transceiver 350 for re-transmission.

As shown, the power harvesting device 100 may further include an indicator 354 disposed between the third and fourth nodes 336, 338 (e.g., in parallel with capacitor 334) that is configured to furnish an indication (e.g., visual, audio, etc.) when the power harvesting device 300 is connected in the right polarity. The indicator 354 may be configured in a variety of ways. For example, the indicator 354 may be comprised of a light emitting device, such as a light emitting diode (LED), or the like, which is configured to provide electromagnetic radiation when in operation. However, it is contemplated that the indicator 354 may comprise other types of indicators such as an audio indicator (e.g., a speaker), a tactile indicator (e.g., a barber pole), combinations thereof, and so forth.

As described above, the power harvesting device 300 is configured to siphon off power from a single current-carrying conductor 102 to power a powered device 340. When the transistor 310 is in an open configuration (e.g., the transistor 310 is off), the boost converter 325 converts the voltage input (e.g., the voltage drop across the diode 318) into an output voltage suitable to power the powered device 340. For instance, the boost converter 325 may generate a 3.3V output based upon a 0.3V input. In another instance, the boost converter 325 may generate a 5V output based upon a 1.3V input. The output voltage charges a capacitor 334 to at least substantially the output voltage (e.g., the high threshold). The charged capacitor 334 is configured to at least partially power the powered device 340 with the stored electric charge. When the charged capacitor 334 reaches the high threshold, a microprocessor 346 is configured to switch the transistor 310 to a closed configuration (e.g., the transistor 310 is on) that causes a drop to the voltage across the nodes 304, 306 due to the current flowing through the transistor 310, which causes the capacitor 138 to discharge. When the capacitor 334 reaches a low threshold, the microprocessor 346 is configured to switch the transistor 310 back to the open configuration so that the voltage across the nodes 304, 306 increases, which allows the capacitor 334 to recharge to at least approximately the high threshold.

As shown in FIG. 5B, the power harvesting device 300 may also be connected to a load 356. It is contemplated that the load 356 may comprise any conventional load element. For example, the load 356 may comprise a capacitive load, a reactive load, a resistive load, an inductive load, a combination thereof, or the like.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A power harvesting device comprising:
   a conductor configured to carry current, the conductor having a first path and a second path, the second path in parallel with the first path;
   an energy storing element coupled to the first path, the energy storing element configured to store energy based upon the current flowing through the first path;
   a first switch coupled to the second path of the conductor, the first switch having an open configuration and a closed configuration;
   a power condition and management device coupled to the energy storing element and operably coupled to the first switch, the power condition and management device configured to switch the first switch to the closed configuration when the energy storing element is measured to have a voltage that is greater than a predefined high voltage threshold and to switch the first switch to the open configuration when the energy storing element is measured to have a voltage that is less than a predefined low voltage threshold,
   wherein the current flows through the second path when the first switch is in the closed configuration allowing the energy storing element to dissipate stored energy and flows through the first path when the first switch is in the open configuration allowing the energy storing element to store energy.

2. The power harvesting device as recited in claim 1, wherein the power condition and management device includes a switched mode power supply configured to receive an input direct current voltage based upon a voltage at the energy storage element, the power condition and management device configured to furnish an output direct current voltage greater than the input direct current voltage.

3. The power harvesting device as recited in claim 1, further comprising a second switch coupled to the first path of the conductor, the second switch having an open configuration and a close configuration, the power condition and management device operably coupled to the second switch, wherein the power condition and management device is further configured to switch the second switch to the open configuration when the energy storing element is measured to have the predefined high voltage threshold and to switch the second switch to the closed configuration when the energy storing element is measured to have the predefined low voltage threshold.

4. The power harvesting device as recited in claim 3, wherein the first switch comprises an enhancement-mode MOSFET device and the second switch comprises a depletion-mode MOSFET device.

5. The power harvesting device as recited in claim 1, further comprising a diode coupled to the first path, wherein the current flows through the first path allowing the energy storage element to store energy when the first switch is in the open configuration and the current flows through the second path allowing the energy storage element to dissipate stored energy when the first switch is in the closed configuration.

6. The power harvesting device as recited in claim 5, wherein the conductor is configured to carry an AC current and the diode comprises a Schottky diode configured to rectify the AC current to a DC current so that the energy storage element stores energy based upon the DC current.

7. The power harvesting device as recited in claim 1, wherein the energy storing element is a capacitor.

8. A power harvesting device comprising:
   a transistor coupled to a conductor configured to carry a direct current, the transistor having an open configuration and a closed configuration;
   a diode coupled to the conductor, the diode configured to generate a voltage drop;
   a boost converter coupled to the conductor, the boost converter configured to receive an input direct current voltage based upon the voltage drop, the boost converter configured to furnish an output direct current voltage, the output direct current voltage greater than the input direct current voltage; and
   a capacitor coupled to the boost converter, the capacitor configured to store an electric charge based upon the output direct current voltage to power a powered device, the powered device operable to detect a low threshold of the stored electric charge and a high threshold of the stored electric charge and to cause the transistor to switch to the open configuration when the stored electric charge is at the low threshold and to the closed configuration when the stored electric charge is at the high threshold.

9. The power harvesting device as recited in claim 8, wherein the powered device includes a microprocessor configured to measure the stored electric charge and to control the transistor so that the transistor switches to the open configuration when the stored electric charge is at a low threshold and switches to the closed configuration when the stored electric charge is at a high threshold.

10. The power harvesting device as recited in claim 8, further comprising an indicator disposed in parallel with the capacitor, the indicator configured to furnish an indication when the power harvesting device is coupled to the conductor in a correct polarity.

11. The power harvesting device as recited in claim 8, wherein the powered device includes a transceiver configured to transmit and to receive wireless signals.

12. The power harvesting device as recited in claim 8, wherein the diode comprises a Schottky diode.

13. A power harvesting device comprising:
   a conductor configured to carry a direct current, the conductor having at least a first node and a second node;
   a transistor having a source connected to the first node, a drain connected to the second node, and a gate, the transistor configured to have an open configuration and a closed configuration;
   a diode having an anode terminal connected to the first node and a cathode terminal connected to the second node, the diode configured to generate a voltage drop across the anode terminal and the cathode terminal;
   a boost converter having a first boost converter terminal connected to the first node, a second boost converter terminal connected to the second node, the first boost converter terminal and the second boost converter terminal configured to receive an input direct current voltage generated by the voltage drop, the boost converter further having a third boost converter terminal and fourth boost converter terminal to furnish an output direct current voltage, the output direct current voltage greater than the input direct current voltage;

a capacitor disposed between the third boost converter terminal and the fourth boost converter terminal, the capacitor configured to store electric charge based upon the output direct current voltage; and a powered device having a first powered device terminal coupled to the third boost converter terminal and a second powered device terminal coupled to the fourth boost converter terminal so that the powered device is at least partially powered by the stored electric charge, the powered device having a third powered device terminal coupled to the gate of the transistor so that the transistor switches to the open configuration when the stored electric charge is at a low threshold and switches to the closed configuration when the stored electric charge is at a high threshold.

14. The power harvesting device as recited in claim 13, wherein the powered device includes a microprocessor configured to measure the stored electric charge and to control the transistor so that the transistor switches to the open configuration when the stored electric charge is at a low threshold and switches to the closed configuration when the stored electric charge is at a high threshold.

15. The power harvesting device as recited in claim 13, wherein the powered device is powered by the stored electric charge.

16. The power harvesting device as recited in claim 13, further comprising an indicator disposed in parallel with the capacitor, the indicator configured to furnish an indication when the power harvesting device is coupled to the conductor in a correct polarity.

17. The power harvesting device as recited in claim 16, wherein the indicator is a light emitting device.

18. The power harvesting device as recited in claim 13, wherein the powered device includes a transceiver configured to transmit and to receive wireless signals.

19. The power harvesting device as recited in claim 13, wherein the diode comprises a Schottky diode.

* * * * *